United States Patent [19]
Britton et al.

[11] Patent Number: 5,386,156
[45] Date of Patent: Jan. 31, 1995

[54] PROGRAMMABLE FUNCTION UNIT WITH PROGRAMMABLE FAST RIPPLE LOGIC

[75] Inventors: Barry K. Britton, Schnecksville; Wai-Bor Leung, Wescosville, both of Pa.

[73] Assignee: AT&T Corp., Murray Hill, N.J.

[21] Appl. No.: 113,154

[22] Filed: Aug. 27, 1993

[51] Int. Cl.[6] .......................................... H03K 19/173
[52] U.S. Cl. .................................... 326/37; 327/407
[58] Field of Search .............. 307/465, 466, 467, 468, 307/469

[56] References Cited

U.S. PATENT DOCUMENTS

| | | | |
|---|---|---|---|
| 4,967,107 | 10/1990 | Kaplinsky | 307/465 |
| 5,027,011 | 6/1991 | Steele | 307/465 |
| 5,260,610 | 11/1993 | Pederson | 307/465 |
| 5,260,611 | 11/1993 | Cliff | 307/465 |
| 5,311,080 | 5/1994 | Britton | 307/465 |
| 5,315,178 | 5/1994 | Snider | 307/465 |

Primary Examiner—Edward P. Westin
Assistant Examiner—Andrew Sanders
Attorney, Agent, or Firm—John T. Rehberg

[57] ABSTRACT

A programmable function unit (PFU) well adapted for use in a field programmable gate array (FPGA) is disclosed. The PFU utilizes programmable fast ripple logic. A programmable generator and/or a programmable propagator are implemented in look up tables in each PFU block. A multiplexer under control of the propagator determines whether to transmit the carry in from the previous block or to transmit the generator signal.

10 Claims, 3 Drawing Sheets

PROGRAMMABLE FUNCTION UNIT WITH PROGRAMMABLE FAST RIPPLE LOGIC

TECHNICAL FIELD

This invention relates to programmable logic devices in general, and has particular applicability to field programmable gate arrays which utilize programmable function units (PFUs).

BACKGROUND OF THE INVENTION

FIG. 1 depicts a programmable function unit (PFU) (also termed in the art a configurable logic block).

Reference numeral 13 denotes an 8-bit look-up table which has three inputs denoted by reference numerals 19, 21, and 23, respectively $A_0$, $B_0$, and the output of multiplexer 15. Multiplexer 15 receives inputs $C_{in}$ and $C_0$ denoted by reference numerals 17 and 35, respectively. The output of look-up table 13 is carried on line 25, denoted by Output$_0$.

Look-up table 13 is pre-programmed to perform a predetermined function of the three inputs on lines 19, 21 and 23, and to provide an output designated Output$_0$ on line 25. In general look-up tables, such as table 13, perform general combinatorial or control logic, RAM or data path functions based upon the inputs $A_0$, $B_0$ and $C_0$. If desired, additional inputs to look-up table (LUT) 13 may be provided, and the size of the look-up table increased. For example, if one more input is provided, the LUT 13 may be a 16 bit LUT.

In order to increase the speed of data path functions, fast-carry logic is implemented. This hard-wired fast-carry operation is provided by a hard-wired logic 27 which has three inputs $A_0$ and $B_0$ and $C_{in}$, reference numerals 19, 21 and 17, respectively. This hard-wired carry logic 27 may also receive additional signals used to implement higher-level functions. Also, in this mode (termed a "ripple mode") multiplexer 15 selects $C_{in}$ as the third input to LUT 13. Thus, in the ripple mode, block 28 receives three inputs, $A_0$ (19), $B_0$ (21), and $C_{in}$ (17) and produces Output$_0$ together with a carry-out signal 18 produced by hard-wired logic 27 as a function of $A_0$ (19), $B_0$(21), and $C_{in}$, (17). This carry-out signal may be used as the carry-in signal to the next block 29. Thus, each block, 28, can perform a single bit of a fast data path operation.

Similar functionality is provided in block 29 producing an Output$_1$ denoted by reference numeral 31 and a carry output $C_{out}$ denoted by reference numeral 33. Generally, blocks such as 28, 29 can be cascaded as needed, thereby creating an n-bit data path function. Typical FPGA PFUs may contain one to eight blocks configured similar to block 28 and linked by carry signals in a manner akin to signal 18 between blocks 28 and 29.

The logic employed in reference numeral 27 is termed "fast-carry logic." One disadvantage to the configuration depicted in FIG. 1 is that the logic in block 27 is hard-wired. Consequently, there is no flexibility in determining the output (e.g., 18) of the fast-carry operation. In addition, logic function 27 may consume a significant amount of silicon real estate.

SUMMARY OF THE INVENTION

A programmable function unit (PFU) well adapted for use in a field programmable gate array (FPGA) is disclosed. The PFU utilizes programmable fast ripple logic. A programmable generator and a programmable propagator are each implemented in look-up tables in each block. A multiplexer under control of the propagator determines whether to transmit the carry-out from the previous block or to transmit the generator signal.

DETAILED DESCRIPTION

An advantage of the present invention is that it permits the fast-carry logic to be programmable. Thus, the logic can perform ripple-type functions other than a fast-carry.

Figure 1:
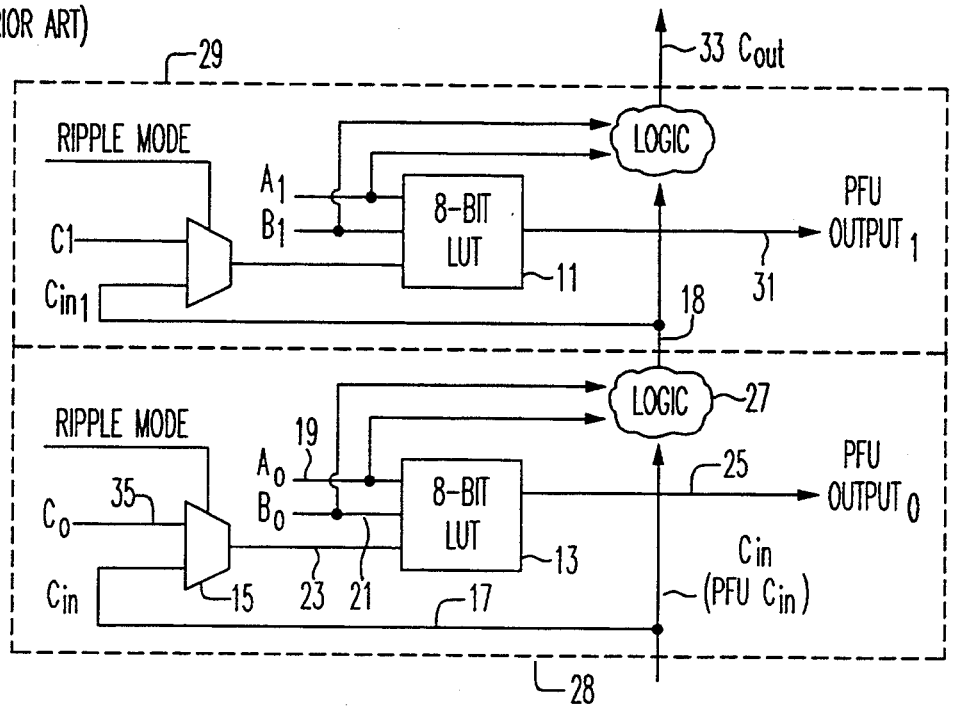
FIG. 1 is a schematic diagram of a prior art programmable function unit.
Figure 2:
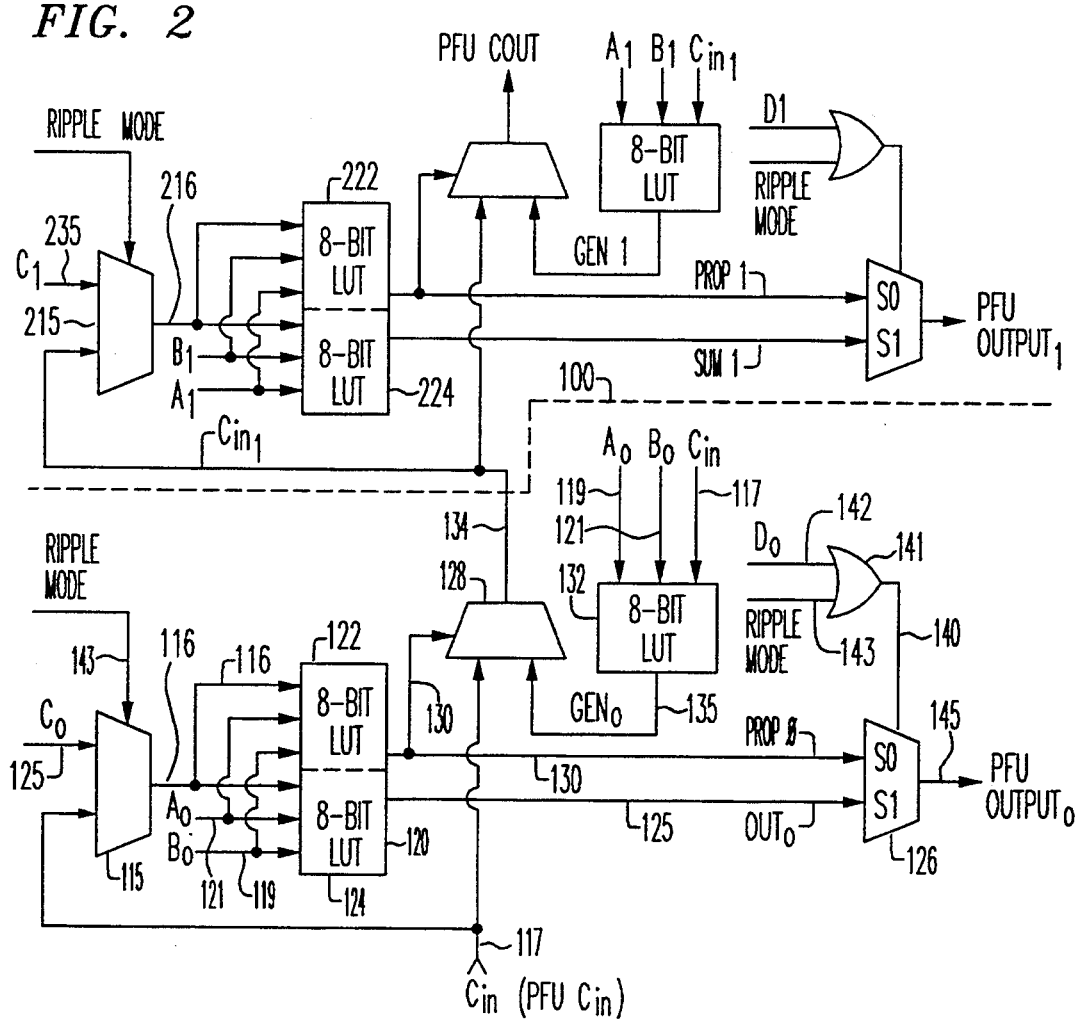
FIGS. 2–4 are schematic diagrams of an illustrative embodiment of the present invention.

Turning to FIG. 2, reference numeral 120 denotes a 16-bit look-up table which may be partitioned into two eight-bit look-up tables 122 and 124, respectively, depending upon the mode of operation desired. (By contrast, the system of FIG. 1 contains only one look-up table per block.) As will be explained below, each 16 bit look-up table can be utilized (together with a multiplexer) to perform any function of four inputs (when not in the ripple mode).

In operation, carry-in signal 117 is multiplexed in multiplexer 115 with input signal $C_0$ denoted by reference numeral 125. The output 116 of multiplexer 115, together with inputs $A_0$ and $B_0$, denoted by reference numerals 119 and 121, is provided to both look-up tables 124 and 122, respectively.

The output of look-up table 124, denoted by reference numeral 125, is Out$_0$. The output of look-up table 122, denoted by reference numeral 130 is a propagate signal, PROP$_0$. In the ripple mode, PROP$_0$ is used as a programmable propagate signal. Programmable signal 130 is input to multiplexer 128. The propagate signal controls multiplexer 128 to determine whether carry-in signal 117 should be "propagated," i.e., passed through as a carry-out signal 134. (As will be explained below, the carry-out signal of one block becomes the carry-in signal of another block.)

Under various circumstances, the user may not want carry-in signal, $C_{in}$, 117 to propagate to the next block (i.e., to line 134). With the present invention, it is possible, if desired, to separately generate a signal based on other signals as well as $C_{in}$ 117 and send this generated signal to output 134 rather than the carry-in signal, $C_{in}$, 117. Look-up table 132 provides a means for generating such a signal, 135. In this embodiment, look-up table 132 is an 8-bit look-up table. Also, in this embodiment, inputs to look-up table 132 are signal $A_0$ denoted by reference numeral 119, signal $B_0$ denoted by reference numeral 121, and carry-in signal denoted by reference numeral 117 (which are the same inputs to look-up tables 122 and 124). Look-up table 132 then produces a "generate" signal 135 which is input to multiplexer 128. Multiplexer 128, under the control of propagate signal 130, determines whether the carry-in signal 117 or the generate signal 1235 will be applied to output 134. Consequently, the output of multiplexer 128 can be any function desired by the programmer. Such flexibility is absent from the hard-wired logic governed system of FIG. 1.

In an alternative embodiment, reference numeral 132 may designate a four-bit look-up table which calculates a generate signal based only upon $A_0$ and $B_0$.

If not in the ripple mode (Ripple Mode="0"), the configuration as shown in FIG. 2 may be used to calculate any function of four inputs. For example, look-up tables 122 and 124 may be each used to calculate a function of three inputs, $A_0$, $B_0$, and $C_0$ (no use is made of $C_{in}$ signal 117 because when the ripple control signal 143 is off ("0"), multiplexer 115 transmits signal $C_0$ 125 and suppresses $C_{in}$ 117. The output of look-up table 122 is carried on signal 130 to multiplexer 126. The output of look-up table 124 is carried on signal 125, also to multiplexer 126. The control signal for multiplexer 126 is received from the output 140 of OR gate 141. Inputs to OR gate 141 are signal $D_0$ 142 and ripple mode signal 143. If ripple control signal 143 is off ("0"), the output of OR gate 141 is $D_0$. Multiplexer 126 then provides output 145 which is thereby any function of four inputs $A_0$, $B_0$, $C_0$, and $D_0$.

When in Ripple Mode (Ripple Mode="1"), the multiplexer 126 always selects $OUT_0$ 125 and places it onto PFU Output$_0$ 145. Thus in ripple mode, PFU Output$_0$ is based upon the output of the LUT 124, having inputs $A_0$, $B_0$, and $C_{in}$. When not in Ripple Mode (Ripple Mode="0"), the multiplexer 126 selects between $OUT_0$ 125 and $PROP_0$ 130 and places it onto PFU Output$_0$ 145, based upon the value of $D_0$. Thus when not in Ripple Mode (Ripple Mode="0"), PFU Output$_0$ is based upon look-up tables 122 and 124, both of which have inputs $A_0$, $B_0$, and $C_0$, as well as the signal $D_0$ which controls the multiplexer 126.

The functionality just described indicated in FIG. 2 below dotted line 100 may be repeated as many times as desired. Above line 100 in FIG. 2 a similar cell is provided. Two 8-bit (or one 16-bit) look-up tables 222, 224 receive inputs $A_1$ and $B_1$ together with input 216 from multiplexer 215. Multiplexer 215 receives inputs $C_1$ 235 and $C_{in}$ which is denoted by reference numeral 134. Signal 134 is termed the "carry-out" from multiplexer 128 and also termed the "carry-in" to multiplexer 215. Thus, signal 134 provides a link between individual blocks of the PFU. A typical modern PFU contains four blocks similar to that just described in FIG. 2 below dotted line 100. If desired, other inputs may be provided to both look-up tables 120 and 132. For example, additional control signals which govern whether look-up tables 120 and/or 122 may perform addition or subtraction under user control may be added.

One advantage of the new PFU over previous PFUs is that the carry signal has programmable functionality. A second advantage is that the look-up table creating the propagate function 130 is used in both ripple mode and non-ripple mode. The look-up table 132 used to create the generate function is only used during ripple mode.

Figure 3:
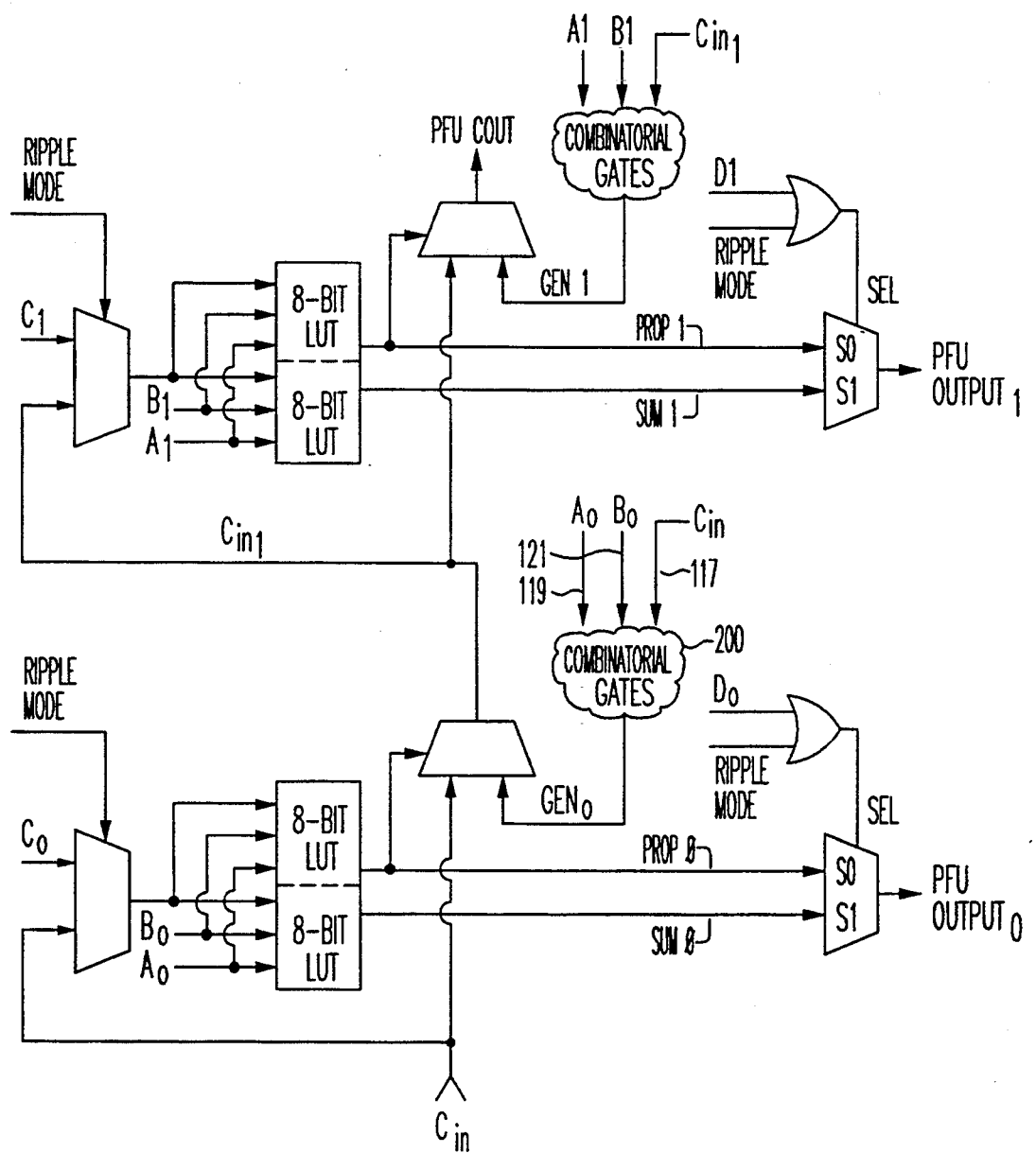

Thus, to save on PFU size, another embodiment of the present invention is depicted in FIG. 3. In general, the circuit illustrated in FIG. 3 is a physically smaller version of the fast programmable generate/propagate depicted in FIG. 2. Thus, a major advantage of the previously-described programmable generate/propagate circuit, namely speed, is maintained, while an area savings is realized as well. A disadvantage is that the generate portion of the circuit is not as programmable as before. FIG. 3 depicts a configuration similar to that shown in FIG. 2. However, programmable look-up table 132 has been replaced by hard-wired logic 200 having inputs $A_0$ 119, $B_0$ 121, and $C_{in}$ 117.

The general PFU output and propagate portions of the circuit of FIG. 3 are the same as FIG. 2. However, the generate portion of the circuit is hard-wired to perform only a small number of functions.

Figure 4:
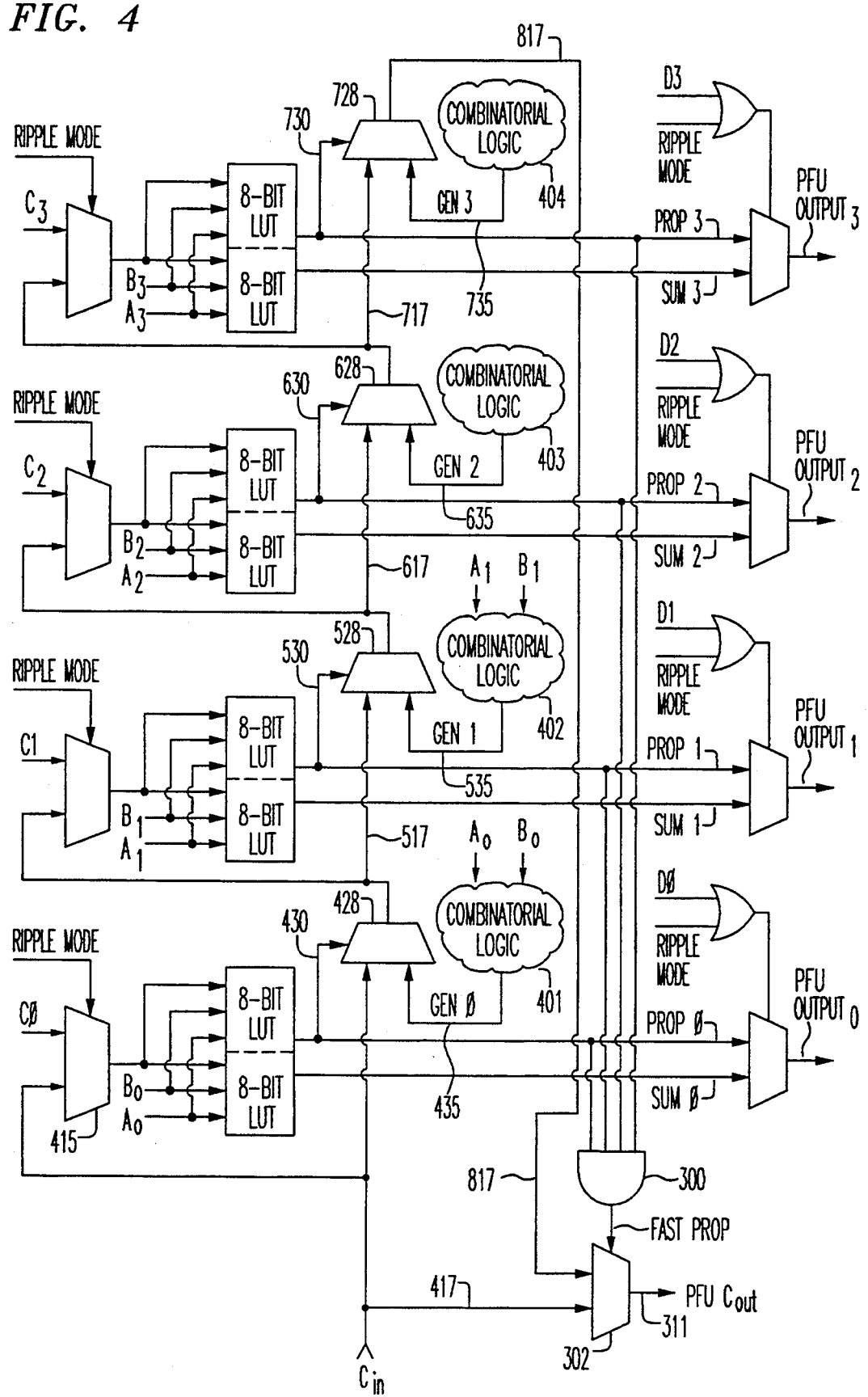

FIG. 4 illustrates an embodiment with four blocks with hard-wired combinatorial generate logic, 401, 402, 403 and 404. In FIG. 4, the general PFU output, generate, and propagate functions for each block are similar to those described in detail in connection with FIG. 2. In addition, the circuit of FIG. 4 features a very fast PFU carry-out on output 311.

If all four of the propagate functions $PROP_0$, $PROP_1$, $PROP_2$ and $PROP_3$ (430, 530, 630 and 730, respectively), are set to "1", then all four blocks would propagate their carry-in to their carry-out. This would ultimately propagate the PFU $C_{in}$ 417 to the PFU $C_{out}$ 311. Therefore a faster PFU $C_{in}$ 417 to PFU $C_{out}$ 311 delay can be obtained by using AND gate 300, which controls multiplexer 302. The four inputs to AND gate 300 are the four propagate signals $PROP_0$, $PROP_1$, $PROP_2$ and $PROP_3$. If all four of these signals are set to "1", then the PFU $C_{in}$ signal 417 is propagated immediately to the PFU $C_{out}$ signal 311 through multiplexer 302 without passing through the fast carry logic in each block, thus decreasing the PFU $C_{in}$ to PFU $C_{out}$ delay. If any of the four propagate signals are "0", then the multiplexer 302 selects the carry out from the last stage 817, thus producing the PFU $C_{out}$ signal 311 in the same manner as in FIG. 3.

We claim:

1. An integrated circuit comprising at least one programmable function unit block having:
   a look-up table having at least three inputs, one of which is termed a carry-in signal and producing at least two outputs, one of said outputs being termed a propagate signal; and one of said outputs being termed an output signal;
   programmable means for generating a function of at least a subset of said inputs to said look-up table, said means producing an output termed a generate signal;
   a multiplexer, operating under the control of said propagate signal, said multiplexer having at least two inputs, one of said inputs being said generate signal and one of said inputs being said carry-in signal and said multiplexer producing at least one output signal termed the carry-out signal.

2. The device of claim 1 in which said look-up table includes first and second eight bit look-up tables, said first eight bit look-up table producing said propagate signal.

3. The device of claim 1 in which said programmable means for creating the generate signal is a look-up table.

4. The device of claim 1 further including an input multiplexer operating under control of an external ripple signal and receiving said carry-in signal and at least one other input signal, the output of the multiplexer being an input to said look up table.

5. The device of claim 1 further including an output multiplexer operating under control of an external ripple signal and receiving said propagate signal and said output signal from said look-up table, said output multiplexer providing an output signal for said programmable function unit.

6. The device of claim 5 further including an OR gate connected to said output multiplexer, to control the operation of said multiplexer, said OR gate having at least two input signals, one of said input signals being said external ripple signal.

7. The device in claim 1 further including a second programmable function unit block, the carry-in signal of said second programmable function unit block being the carry-out signal of said first programmable function unit block.

8. An integrated circuit comprising at least first and second programmable function unit (PFU) blocks; each of said blocks having:
   a) a respective look-up table having at least three inputs, one of which is termed a carry-in signal and producing at least two outputs, one of said outputs being termed a propagate signal, and one of said outputs being termed an output signal;
   b) programmable means for generating a function of at least a subset of said inputs to said look-up table, said means producing an output termed a generate signal; and
   c) a multiplexer, operating under the control of said propagate signal, said multiplexer having at least two inputs, one of said inputs being said generate signal, and one of said inputs being said carry-in signal, and said multiplexer producing at least one output signal termed the carry-out signal;
   the said carry-out output of the said multiplexer of said first PFU block being the said carry-in input to said second PFU block.

9. The device of claim 8 in which each said PFU block further includes a second multiplexer, operating under control of said external ripple mode signal, said second multiplexer having said propagate signal and said output of said look-up table as inputs and producing an output signal for said programmable function unit.

10. The device of claim 8 further including an AND gate having said propagate signals from first and second PFU blocks as inputs and producing an output termed a "fast propagate control," and further including a third multiplexer, operating under the control of said fast propagate control signal, said third multiplexer having two inputs, one of said inputs being the said carry-out output of said first multiplexer of said second PFU block and the other of said inputs being the said carry-in signal input to said first multiplexer of said first block, said third multiplexer producing a single carry-out output.

* * * * *